US012351902B2

(12) United States Patent
Dezelah et al.

(10) Patent No.: US 12,351,902 B2
(45) Date of Patent: Jul. 8, 2025

(54) METHODS AND SYSTEMS FOR DELIVERY OF VANADIUM COMPOUNDS

(71) Applicant: ASM IP Holding B.V., Almere (NL)

(72) Inventors: Charles Dezelah, Helsinki (FI); Qi Xie, Wilsele (BE); Petri Raisanen, Gilbert, AZ (US); Dieter Pierreux, Dilbeek (BE); Bert Jongbloed, Oud-Heverlee (BE); Werner Knaepen, Leuven (BE); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 600 days.

(21) Appl. No.: 17/316,847

(22) Filed: May 11, 2021

(65) Prior Publication Data
US 2021/0348267 A1 Nov. 11, 2021

Related U.S. Application Data

(60) Provisional application No. 63/023,130, filed on May 11, 2020.

(51) Int. Cl.
*C23C 16/02* (2006.01)
*C23C 16/44* (2006.01)
*C23C 16/455* (2006.01)

(52) U.S. Cl.
CPC .......... *C23C 16/02* (2013.01); *C23C 16/4402* (2013.01); *C23C 16/45557* (2013.01); *C23C 16/45553* (2013.01)

(58) Field of Classification Search
CPC ............... C23C 16/02; C23C 16/4402; C23C 16/45557; C23C 16/45553; C23C 16/14;
(Continued)

(56) References Cited

U.S. PATENT DOCUMENTS 3,395,974 A 8/1968 Berry
3,494,728 A * 2/1970 Letson .................. C01G 31/04
423/492
(Continued)

FOREIGN PATENT DOCUMENTS

CN 103014701 A 4/2013
CN 105732699 B 7/2018
(Continued)

OTHER PUBLICATIONS

K.E. Spear, et al., "Chemical Transport Reactions in the Vanadium-Silicon-Oxygen System and the Ternary Phase Diagram," Journal of the Less Common Metals, vol. 14, Issue 1, 1968, pp. 69-75, ISSN 0022-5088.
(Continued)

*Primary Examiner* — Brian K Talbot
(74) *Attorney, Agent, or Firm* — Snell & Wilmer L.L.P

(57) ABSTRACT

A method may comprise disposing vanadium tetrachloride in a delivery vessel; delivering the vanadium tetrachloride to a reaction chamber in fluid communication with the delivery vessel; mitigating the delivery of decomposition products of the vanadium tetrachloride to the reaction chamber; and/or applying the vanadium tetrachloride to a substrate disposed in the reaction chamber to form a layer comprising vanadium on the substrate.

16 Claims, 7 Drawing Sheets

(58) Field of Classification Search
CPC . C23C 16/45561; C23C 16/52; C23C 16/466; C23C 16/448; C23C 16/452
USPC .................................. 427/255.28, 255.394
See application file for complete search history.

(56) References Cited

U.S. PATENT DOCUMENTS

| | | | |
|---|---|---|---|
| 4,054,686 A | 10/1977 | Newkirk | |
| 4,202,866 A * | 5/1980 | Feng | B01J 27/10 423/492 |
| 4,364,873 A | 12/1982 | Diefenbach | |
| 4,393,095 A | 7/1983 | Greenberg | |
| 4,525,551 A | 6/1985 | Schmidt | |
| 4,808,387 A * | 2/1989 | Datta | A61F 13/533 526/143 |
| 4,871,523 A * | 10/1989 | Datta | C08F 10/00 526/143 |
| 6,156,395 A | 12/2000 | Zhang | |
| 8,197,721 B2 | 6/2012 | Stuart | |
| 8,404,127 B2 | 3/2013 | Jiang | |
| 9,691,771 B2 | 6/2017 | Lansalot-Matras | |
| 10,847,362 B2 | 11/2020 | Park et al. | |
| 10,882,874 B2 | 1/2021 | Okabe | |
| 2005/0013771 A1* | 1/2005 | Amendola | C01B 7/01 423/658.2 |
| 2007/0048438 A1 | 3/2007 | Parkin | |
| 2009/0011145 A1 | 1/2009 | Yun | |
| 2011/0159210 A1 | 6/2011 | Patrovsky | |
| 2013/0299335 A1 | 11/2013 | Helberg | |
| 2013/0309876 A1* | 11/2013 | Ogawa | H01L 21/318 438/758 |
| 2014/0234194 A1 | 8/2014 | Zwieback | |
| 2016/0083405 A1 | 3/2016 | Lansalot-Matras | |
| 2016/0304542 A1 | 10/2016 | Lansalot-Matras | |
| 2016/0307905 A1* | 10/2016 | Lansalot-Matras | H01G 13/003 |
| 2018/0134575 A1* | 5/2018 | Van Vuuren | C01G 31/04 |
| 2019/0177346 A1* | 6/2019 | Okabe | C07F 9/005 |
| 2019/0287769 A1 | 9/2019 | Blomberg | |
| 2020/0198967 A1* | 6/2020 | Habuka | C23C 16/52 |
| 2020/0346928 A1* | 11/2020 | Habuka | C23C 16/34 |
| 2021/0005450 A1 | 1/2021 | Mattinen | |
| 2021/0180184 A1 | 6/2021 | Alessio Verni | |
| 2021/0242011 A1 | 8/2021 | Shero | |
| 2021/0246023 A1 | 8/2021 | Habuka | |
| 2021/0246553 A1 | 8/2021 | Arteaga | |
| 2021/0331935 A1 | 10/2021 | Dezelah | |
| 2021/0332476 A1 | 10/2021 | Homm Jara | |
| 2021/0335612 A1 | 10/2021 | Deminskyi | |
| 2021/0335615 A1 | 10/2021 | Pierreux | |
| 2021/0348267 A1 | 11/2021 | Dezelah | |
| 2021/0371978 A1* | 12/2021 | Shero | C23C 16/4481 |
| 2022/0127724 A1 | 4/2022 | Dezelah | |
| 2022/0282374 A1 | 9/2022 | Alessio Verni | |
| 2022/0315612 A1 | 10/2022 | Li | |
| 2023/0357924 A1 | 11/2023 | Shero | |

FOREIGN PATENT DOCUMENTS

| | | |
|---|---|---|
| CN | 110318021 B | 8/2020 |
| CN | 110699670 B | 11/2021 |
| CN | 114438472 A | 5/2022 |
| CN | 117466336 A | 1/2024 |
| EP | 2808335 A1 | 12/2014 |
| EP | 2808336 A1 | 12/2014 |
| NO | 882110 L | 11/1988 |
| PL | 147562 B1 | 6/1989 |
| WO | 2022226472 A1 | 10/2022 |
| WO | 2023229953 A1 | 11/2023 |

OTHER PUBLICATIONS

Roddy, J.W., "Transport Reactions and Vaporization Studies of Some Vanadium Halides." 1962.

Saeki, Yuzo et al., "Reaction Process of Vanadium Tetrachloride with Ammonia in the Vapor Phase and Properties of the Vanadium Nitride Formed." Bull. Chem. Soc. Jpn. vol 55. No. 11, 3446-3449(1982), https://doi.org/10.1246/bcsj.55.3446.

* cited by examiner

METHODS AND SYSTEMS FOR DELIVERY OF VANADIUM COMPOUNDS

CROSS-REFERENCE TO RELATED APPLICATIONS

This application is a Nonprovisional of, and claims priority to and the benefit of, U.S. Provisional Patent application No. 63/023,130, filed May 11, 2020 and entitled "METHODS AND SYSTEMS FOR DELIVERY OF VANADIUM COMPOUNDS," which is hereby incorporated by reference herein.

FIELD OF DISCLOSURE

The present disclosure generally relates to methods and apparatuses suitable for gas-phase reactor systems. More particularly, the disclosure relates to methods, compounds, and systems that can be used to stabilize precursors and mitigate against contamination in the gas-phase reactor systems.

BACKGROUND OF THE DISCLOSURE

Precursors are compounds that can be used to form another material. For example, precursors can be used in gas-phase reactions to form thin films or layers of materials. Unfortunately, some precursors that may have desirable properties, such as desirable vapor pressure at normal pressure and temperature, and/or desired reactivity—e.g., with a surface or another compound—may decompose into other compounds. In particular, some precursors can decompose to produce corrosive gas, which can corrode parts of a reactor system and/or lead to undesired etching during processing. The decomposition can reduce a shelf life of the precursor, complicate manufacturing, require additional purification steps, cause storage and/or shipment problems, and can limit an amount of desired material within a source vessel that is available for reactions within the reactor system. Further, corrosion of reactor system parts can reduce a lifetime of the reactor system and/or parts thereof and consequently increase a cost of operating such equipment. Further, the corrosion can lead to incorporation of reactor system etch products within a deposited film and/or cause etching of a film on a substrate, which, in turn, can lead to a reduction in quality and/or uniformity of such films. Further, because a rate of precursor decomposition generally increases with temperature, an ability to increase flux of the precursor to the reaction chamber by heating the precursor is hampered.

Efforts to reduce decomposition of precursors have resulted in precursors that produce films with undesirably high carbon content, can require an undesirably high temperature to obtain desired flux rates, can result in chemical vapor deposition (CVD) of material when atomic layer deposition (ALD) is desired, can lack desired control of growth rate, and/or can exhibit relatively poor step coverage. Accordingly, improved methods, apparatus and composition for providing precursors for gas-phase reactions are desired.

Any discussion, including discussion of problems and solutions, set forth in this section has been included in this disclosure solely for the purpose of providing a context for the present disclosure. Such discussion should not be taken as an admission that any or all of the information was known at the time of this disclosure or otherwise constitutes prior art.

SUMMARY OF THE DISCLOSURE

This summary introduces a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods and systems for mitigating decomposition of, and/or stabilizing, a vanadium compound used as precursor in a deposition process (e.g., atomic layer deposition), and/or mitigating the delivery of decomposition products of vanadium compounds to a reaction chamber.

In accordance with exemplary embodiments of the disclosure, a method may comprise disposing vanadium tetrachloride in a delivery vessel; delivering the vanadium tetrachloride to a reaction chamber in fluid communication with the delivery vessel; mitigating the delivery of decomposition products of the vanadium tetrachloride to the reaction chamber; and/or applying the vanadium tetrachloride to a substrate disposed in the reaction chamber to form a layer comprising vanadium on the substrate.

In various embodiments, mitigating the delivery of decomposition products of the vanadium tetrachloride, which may comprise vanadium trichloride and chlorine gas, may comprise mitigating decomposition of the vanadium tetrachloride within the delivery vessel. In various embodiments, mitigating decomposition of the vanadium tetrachloride within the delivery vessel may comprise supplying excess chlorine gas to the delivery vessel before the delivering the vanadium tetrachloride to the reaction chamber. In various embodiments, mitigating decomposition of the vanadium tetrachloride within the delivery vessel may comprise transferring the vanadium tetrachloride and the chlorine gas from the delivery vessel to a disposal tank; and/or delivering fresh vanadium tetrachloride into the delivery vessel before the delivering the vanadium tetrachloride to the reaction chamber. In various embodiments, mitigating decomposition of the vanadium tetrachloride within the delivery vessel may comprise removing the chlorine gas from the delivery vessel. In various embodiments, removing the chlorine gas from the delivery vessel may further comprise removing solubilized chlorine gas comprised in a composition comprising the vanadium tetrachloride from the delivery vessel. In various embodiments, mitigating decomposition of the vanadium tetrachloride within the delivery vessel may comprise periodically venting, through a vent valve of the delivery vessel, one or more of the decomposition products out of the delivery vessel based on a timed venting schedule.

In various embodiments, the delivery vessel may comprise a bottom recessed area, wherein a tip of a dip tube may be disposed within the bottom recessed area. In various embodiments, the fresh vanadium tetrachloride may be disposed into the delivery vessel from a bulk supply tank in fluid communication with the delivery vessel. In various embodiments, the method may further comprise mitigating decomposition of the fresh vanadium tetrachloride within the bulk supply tank. In various embodiments, mitigating decomposition of the fresh vanadium tetrachloride within the bulk supply tank may comprise supplying excess chlorine gas to the bulk supply tank. In various embodiments, mitigating decomposition of the fresh vanadium tetrachloride within the bulk supply tank may comprise removing the chlorine gas from the bulk supply tank. In various embodiments, removing the chlorine gas from the bulk supply tank may further comprise removing solubilized chlorine gas comprised in a composition comprising the fresh vanadium tetrachloride from the bulk supply tank. In various embodiments, mitigating decomposition of the fresh vanadium tetrachloride within the bulk supply tank may comprise periodically venting, through a vent valve of the bulk supply tank, one or more of the decomposition products out of the bulk supply tank based on a timed venting schedule.

In various embodiments, the method may further comprise monitoring a pressure within the delivery vessel. Mitigating decomposition of the vanadium tetrachloride within the delivery vessel may comprise venting, through a vent valve of the delivery vessel, one or more of the decomposition products out of the delivery vessel in response to the pressure reaching or exceeding a pressure threshold level. In various embodiments, the method may further comprise monitoring a pressure within the bulk supply tank. Mitigating decomposition of the fresh vanadium tetrachloride within the bulk supply tank may comprise venting, through a vent valve of the bulk supply tank, one or more of the decomposition products out of the bulk supply tank in response to the pressure reaching or exceeding a pressure threshold level.

In various embodiments, delivering vanadium tetrachloride to the reaction chamber may comprise flowing a composition comprising the vanadium tetrachloride through a filter that removes chlorine gas comprised in the composition.

In various embodiments, a reactor system (and/or a chemical delivery system comprised therein) may comprise the components described herein to perform the discussed methods and method steps. In various embodiments, at least one of the reaction chamber and delivery vessel comprises stainless steel. In various embodiments, a reactor system may further comprise a pressure monitor configured to monitor a pressure within at least one of the delivery vessel and a bulk supply tank fluidly coupled to the delivery vessel.

These and other embodiments will become readily apparent to those skilled in the art from the following detailed description of certain embodiments having reference to the attached figures. The disclosure is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures. Elements with the like element numbering throughout the figures are intended to be the same.

Figure 1:
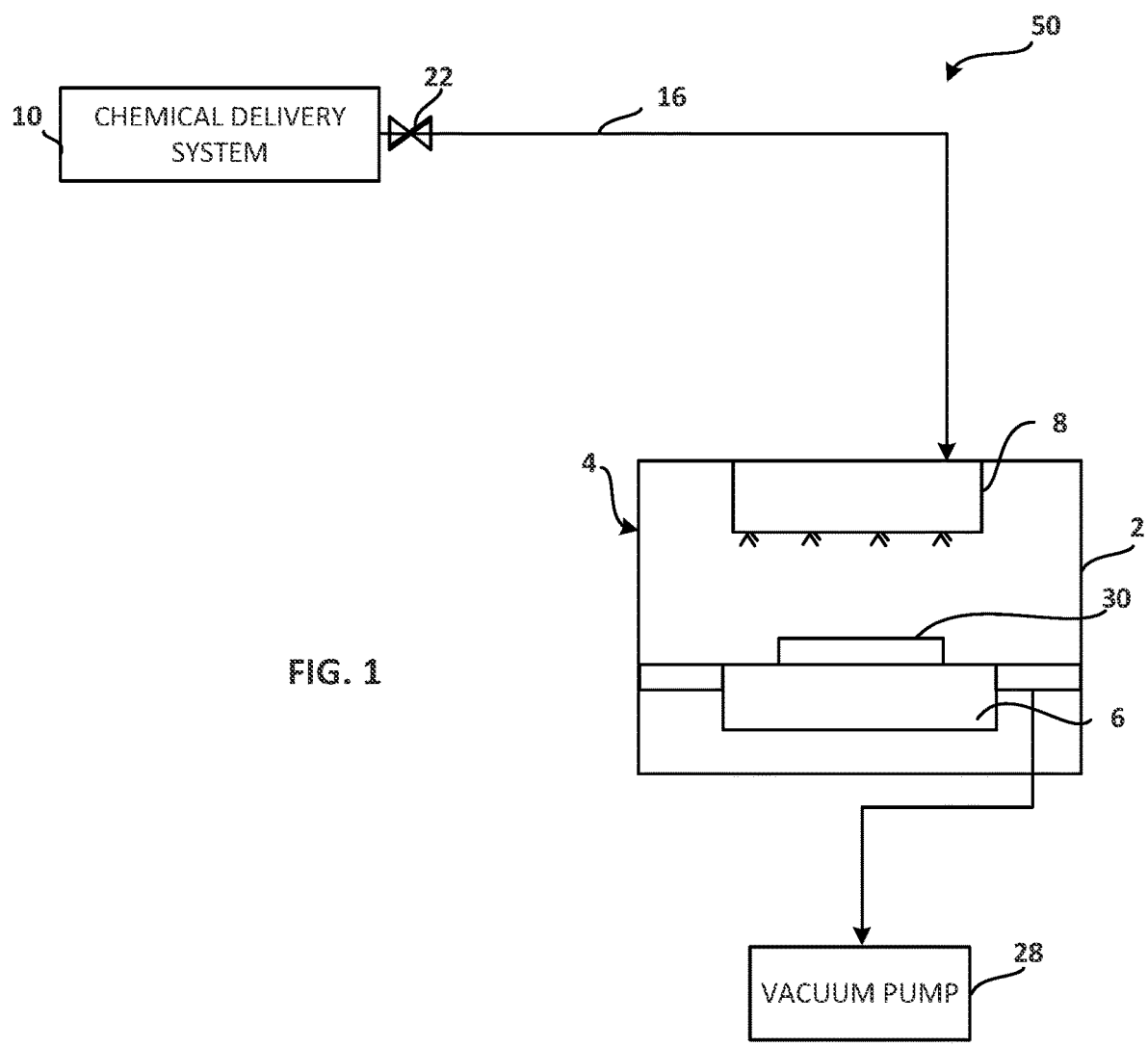
FIG. 1 illustrates a schematic depiction of an exemplary reactor system, in accordance with various embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, compositions, vessels, apparatus, systems, and uses thereof provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. Unless otherwise noted, the exemplary embodiments or components thereof may be combined or may be applied separate from each other.

As set forth in more detail below, various embodiments of the disclosure provide systems and methods to, or to facilitate, transporting, storing, and/or suppling a composition and/or a vanadium compound to a (e.g., gas-phase) reaction chamber of a reactor system. Exemplary systems and methods function to mitigate unwanted decomposition of the vanadium compound and/or mitigate the delivery of the decomposition products of the vanadium compound to a reaction chamber. The methods, compositions, vessels, apparatus, systems, and uses thereof as described herein can be used for a variety of applications.

In this disclosure, "gas" can include material that is a gas at normal temperature and pressure (NTP), a vaporized solid, and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. The term "inert gas" can refer to a gas that does not take part in a chemical reaction and/or does not become a part of a film matrix to an appreciable extent. Exemplary inert gases include helium, argon, and/or any combination thereof. In some cases, an inert gas can include nitrogen and/or hydrogen.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, a "structure" can be or include a substrate as described herein. Structures can include one or more layers overlying the substrate, such as one or more layers formed according to a method as described herein. Devices and device portions can be or include structures or be formed using the structures.

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, or example a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

As used herein, a "vanadium compound" includes compounds that can be represented by a chemical formula that includes vanadium. As used herein, a "vanadium precursor" includes a gas or a material that can become gaseous (e.g., a liquid that is vaporized) and that can be represented by a chemical formula that includes vanadium.

As used herein, a "vanadium halide precursor" includes a gas or a material that can become gaseous and that can be represented by a chemical formula that includes vanadium and a halogen, such as one or more of fluorine (F), chlorine (Cl), bromine (Br), and iodine (I).

As used herein, a "vanadium layer" or "a layer including vanadium" can be a material layer that can be represented by a chemical formula that includes vanadium. The vanadium layer can include one or more of oxygen, nitrogen, sulfur, and carbon—e.g., vanadium carbon nitrogen layers. For example, the vanadium layer can be a binary compound that includes vanadium and another element, such as C, N, O, S, or a ternary compound comprising vanadium and two or more other elements, such as two of more of C, N, O, S. A chemical formula for the vanadium layer material can be represented by $M_b X_y Z_a$, where M is vanadium, and X can be C, N, O, S, and Z can be C, N, O, S, and wherein b is greater than 0 and less than one, and y and a can range from 0 to less than 1.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of" or "consisting of" in some embodiments. Further, whether or not expressly stated, compositions and compounds described herein can comprise, consist essentially of, or consist of compounds and agents noted herein. In this disclosure, any defined meanings do not necessarily exclude ordinary and customary meanings in some embodiments.

Reactor systems used for ALD, CVD, and/or the like, may be used for a variety of applications, including depositing and etching materials on a substrate surface. In various embodiments, a reactor system 50 may comprise a reaction chamber 4, a susceptor 6 to hold a substrate 30 during processing, a fluid distribution system 8 (e.g., a showerhead) to distribute one or more reactants to a surface of substrate 30, a chemical delivery system 10 to deliver one or more reactants from reactant sources, and/or a carrier and/or purge gas from such a source to reaction chamber 4, fluidly coupled to reaction chamber 4 via one or more lines (e.g., line 16), and valves or controllers (e.g., valve 22). Reactant gases or other materials from reactant sources in chemical delivery system 10 may be applied to substrate 30 in reaction chamber 4. A purge gas from the purge gas source in chemical delivery system 10 may be flowed to and through reaction chamber 4 to remove any excess reactant or other undesired materials from reaction chamber 4. System 50 may also comprise a vacuum source 28 fluidly coupled to the reaction chamber 4, which may be configured to suck or pump reactants, a purge gas, or other materials out of reaction chamber 4.

Figure 2:
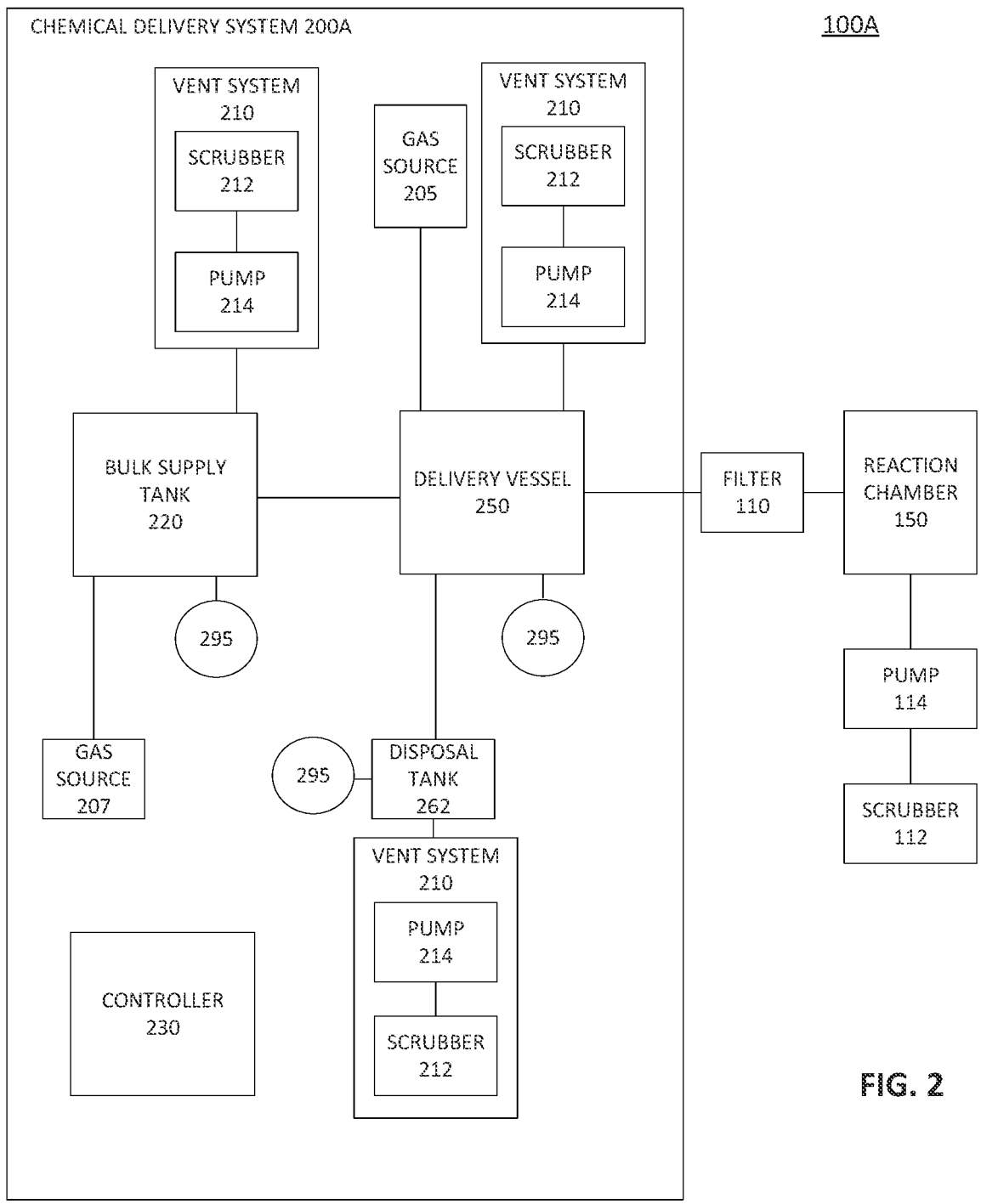
FIG. 2 illustrates a schematic depiction of an exemplary reactor system comprising a chemical delivery system, in accordance with various embodiments of the disclosure.
Figure 3:
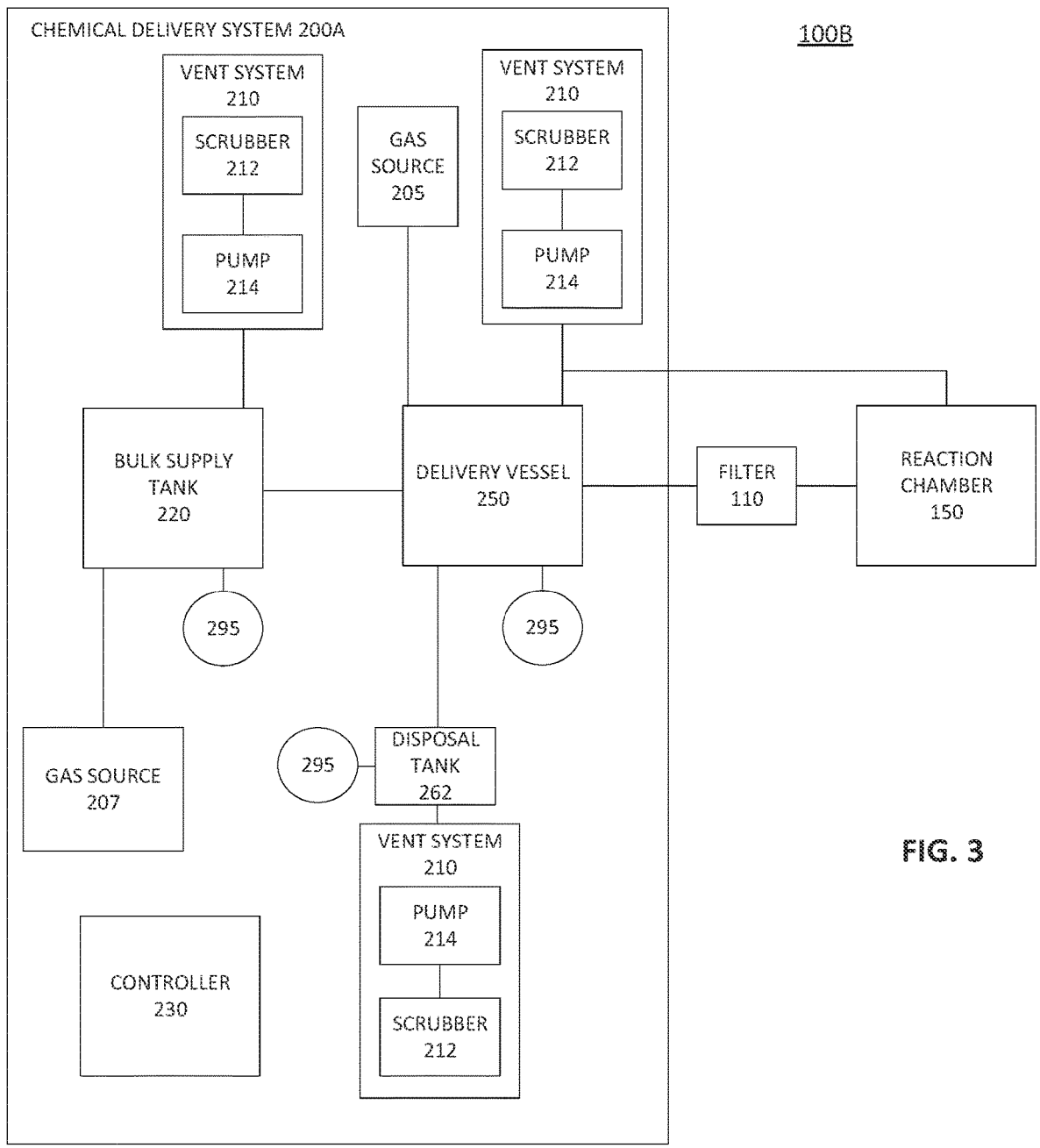
FIG. 3 illustrates a schematic depiction of another exemplary reactor system comprising a chemical delivery system, in accordance with various embodiments of the disclosure.
Figure 4:
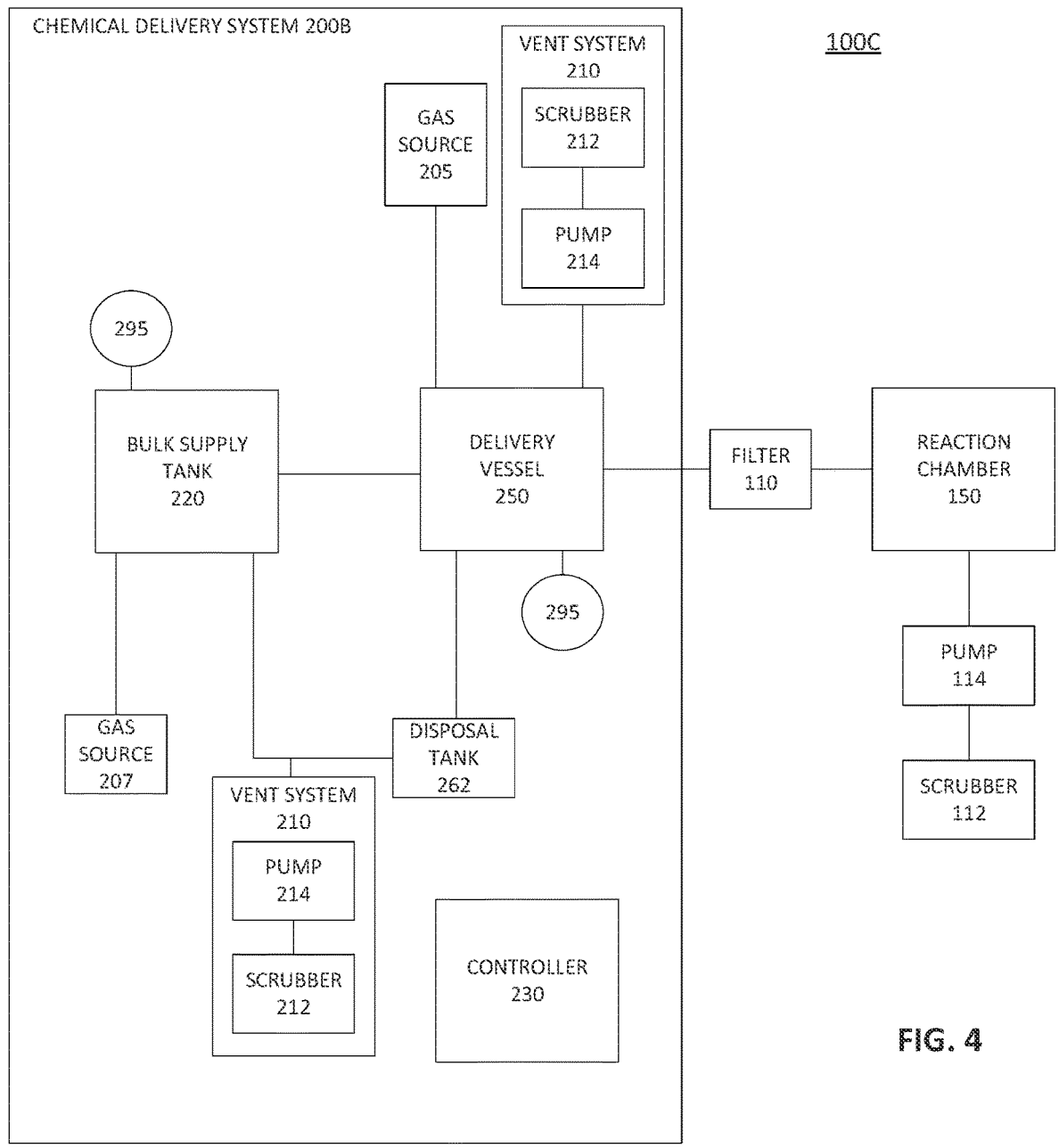
FIG. 4 illustrates a schematic depiction of yet another exemplary reactor system comprising a chemical delivery system, in accordance with various embodiments of the disclosure.

FIGS. 2-4 illustrate reactor systems 100A-100C (examples of reactor system 50) in accordance with various embodiments of the disclosure. Systems 100A-100C can be used to perform a method as described herein and/or form a structure or device portion as described herein.

In various embodiments, a reactor system (e.g., reactor systems 100A-100C) may comprise a chemical delivery system (e.g., chemical delivery system 200A depicted in FIGS. 2 and 3, and chemical delivery system 200B depicted in FIG. 4) and a reaction chamber (e.g., reaction chamber 150). The chemical delivery system may be fluidly coupled to reaction chamber such that the chemical delivery system may transfer or deliver one or more gases, precursors, reactants, and/or the like, and/or a purge or carrier gas, to the reaction chamber. The reaction chamber in a reactor system may be any suitable reaction chamber, such as an ALD or CVD reaction chamber.

In various embodiments, a chemical delivery system may comprise a delivery vessel (e.g., delivery vessel 250), a bulk supply tank (e.g., bulk supply tank 220), a disposal tank (e.g., disposal tank 262), a gas source (e.g., gas source 205 and/or 207), a vent system (e.g., vent system(s) 210), a pressure monitor (e.g., pressure monitor(s) 295), and/or a controller (e.g., controller 230). The components of a chemical delivery system may be arranged and coupled to one another in any suitable configuration. In various embodiments, a chemical delivery system may comprise one or more of each of these components (e.g., one or more delivery vessels, bulk supply tanks, disposal tanks, vent systems, etc.).

In various embodiments, the controller may be comprised in, or external to, a chemical delivery system. A controller may be in electronic communication with one or more of the components of a chemical delivery system, and/or each component may be in electronic communication with a respective controller. The controller may comprise a processor and/or a non-transitory, tangible, computer-readable medium to communicate with the processor having instructions stored thereon that, in response to execution by the processor, cause the processor to perform certain operations, such as causing a vent system to vent fluid from a tank or vessel, deliver or transfer a fluid between a tank or vessel in the chemical deliver system, and/or deliver or transfer a fluid to a reaction chamber, for example, at a certain rate, in a certain pattern, and/or at a certain time.

A controller may include electronic circuitry and software to selectively operate valves, manifolds, heaters, pumps and other components included in a chemical delivery system and/or reactor system. Such circuitry and components operate to introduce precursors, reactants, and purge gases from respective sources. By way of examples, a controller can be configured to control a flow of the composition or the vanadium compound into or between a delivery vessel, a bulk supply tank, a disposal tank, and/or a reaction chamber. A controller can control timing of gas pulse sequences, temperature of the substrate and/or reaction chamber, pressure within a reaction chamber, and various other operations to provide proper operation of the chemical delivery system and/or reactor system. A controller can include control software to electrically or pneumatically control valves to control flow of precursors, reactants and purge gases into and out of, and/or between, a delivery vessel, a bulk supply tank, a disposal tank, and/or a reaction chamber. A controller may include modules such as a software or hardware component, e.g., a FPGA or ASIC, which performs certain tasks. A module can advantageously be configured to reside on the addressable storage medium of the control system and be configured to execute one or more processes.

In various embodiments, a delivery vessel (e.g., delivery vessel 250) of a chemical delivery system may be used to transfer or deliver one or more gases, precursors, reactants, and/or the like, and/or a purge or carrier gas, to a reaction chamber. A gas source (e.g., gas source 205) may supply such gases, precursors, reactants, and/or the like to the delivery vessel. A delivery vessel may be fluidly coupled to a reaction chamber.

In various embodiments, a bulk supply tank (e.g., bulk supply tank 220) of a chemical delivery system may be used to transfer or delivery one or more gases, precursors, reactants, and/or the like, and/or a purge or carrier gas, to a delivery vessel. For example, a bulk supply tank may comprise fresh precursor, reactant, and/or the like to be supplied to the delivery vessel to replenish and/or replace precursor, reaction, and/or the like within the delivery vessel. A gas source (e.g., gas source 207) may supply such gases, precursors, reactants, and/or the like to the bulk supply tank. The bulk supply tank may be fluidly coupled to the delivery vessel.

A vent system (e.g., vent system(s) 210) may be coupled to a delivery vessel to vent or pump excess or undesired fluid (i.e., liquid or gas) from the delivery vessel. Similarly, a vent system may be coupled to a bulk supply tank to vent or pump excess or undesired fluid (i.e., liquid or gas) from the bulk supply tank. Similarly, a vent system may be coupled to a disposal tank to vent or pump excess or undesired fluid (i.e., liquid or gas) from the disposal tank. A delivery vessel, bulk supply tank, and/or disposal tank may comprise a vent valve, through which vented fluid may flow. A vent system may comprise a pump 214 to pump the fluid from the delivery vessel, bulk supply tank, and/or disposal tank, and/or a scrubber 212 to remove any unwanted particulate, contaminant, or the like from the vented fluid. In various embodiments, a vent system may be coupled to each tank or vessel within a chemical delivery system (e.g., in chemical delivery system 200A, a separate vent system 210 is coupled to each of delivery vessel 250, bulk supply tank 220, and disposal tank 262). In various embodiments, a delivery vessel, bulk supply tank, and/or disposal tank may be coupled to a single vent system, which is utilized to pump fluid from the delivery vessel, bulk supply tank, and/or disposal tank (e.g., the vent system 210 shared between bulk supply tank 220 and disposal tank 262 in chemical delivery system 200B).

In various embodiments, a pressure monitor may be coupled to each tank or vessel in a chemical delivery system (e.g., each of delivery vessel 250, bulk supply tank 220, and disposal tank 262 is coupled to a pressure monitor 295 in chemical delivery systems 200A and 200B). Each tank or vessel in a chemical delivery system may be coupled to a respective pressure monitor, or one or more tanks or vessels may be coupled to a common pressure monitor. The pressure monitor may be configured to measure and/or monitor a pressure within the respective tank(s) or vessel(s). If, for example, the pressure within a tank or vessel reaches or exceeds a threshold pressure value, the excess fluid within such tank or vessel may be vented through a respective vent system (which may be facilitated or commanded by a controller (e.g., controller 230)).

The components of a reactor system (and/or a chemical delivery system comprised therein) may comprise any suitable material, such as stainless steel.

The chemical delivery systems in accordance with various embodiments of this disclosure may be configured to mitigate or prevent the decomposition of a precursor, reactant, and/or the like that is to be delivered to a reaction chamber. Similarly, such chemical delivery systems may be configured to mitigate or prevent the delivery of decomposition products from a precursor, reactant, and/or the like from the chemical delivery system to a reaction chamber.

Vanadium compounds used within reactor systems in accordance with various embodiments of this disclosure may be used to form vanadium layers suitable for metal oxides semiconductor (MOS) applications (e.g., as a work function layer and/or dipole or flatband shifter), such as in the formation of complimentary MOS (CMOS) devices, for use as etch stop layers, and/or for use as barrier or liner layers (e.g., in MEOL and BEOL processing). For example, the vanadium layers can be used in the formation of logic devices, dynamic random-access memory (DRAM), three-dimensional NAND devices, as a p-metal layer gate of a logic device, as a p-dipole layer for logic devices, and the like. However, unless noted otherwise, the disclosure is not necessarily limited to such examples.

Figure 6:
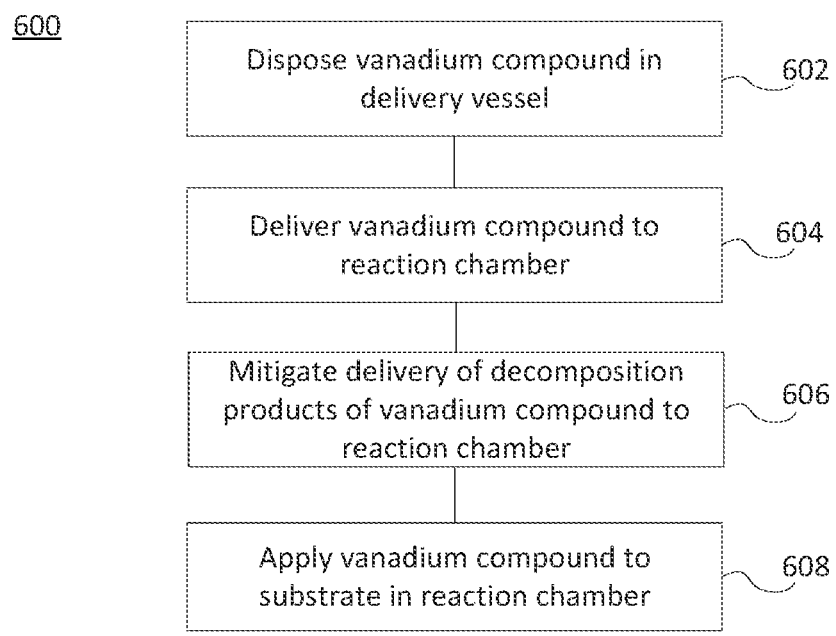
FIG. 6 illustrates a method for applying a vanadium compound to a substrate in a reaction chamber, in accordance with various embodiments of the disclosure.

With reference to method 600 depicted in FIG. 6, in addition to FIGS. 2-4, to form a vanadium layer on a substrate, a vanadium compound may be disposed in a delivery vessel (e.g., delivery vessel 250) (step 602). The vanadium compound may be delivered or transferred to a reaction chamber (e.g., reaction chamber 150) (step 604) and applied to a substrate in the reaction chamber (step 608).

In various embodiments, applying a vanadium compound to a substrate in a reaction chamber (step 608) may be accomplished using a cyclical deposition process, depositing a layer comprising vanadium onto a surface of the substrate. The cyclical deposition process can include (e.g., separately and/or sequentially) providing a vanadium precursor to the reaction chamber and providing a reactant to the reaction chamber. During step 608, a vanadium layer is deposited onto a surface of the substrate using a cyclical deposition process. As noted above, the cyclical deposition process can include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of reactants. Such a process may be referred to as cyclical CVD. In some embodiments, a cyclical CVD process may comprise the introduction of two or more reactants into the reaction chamber, wherein there may be a time period of overlap between the two or more reactants in the reaction chamber resulting in both an ALD component of the deposition and a CVD component of the deposition. This is referred to as a hybrid process. In accordance with further examples, a cyclical deposition process may comprise the continuous flow of one reactant/precursor and the periodic pulsing of a second reactant into the reaction chamber.

A thickness of vanadium layer can vary according to application. By way of examples, a thickness of vanadium layer can be less than 5 nm or about 0.1 nm to about 10 nm, or about 0.1 nm to about 5 nm, or about 0.2 nm to about 5 nm, or about 0.3 nm to about 3 nm, or about 0.3 nm to about 1 nm. When used to replace layers that may include aluminum, rather than vanadium, a vanadium layer may be relatively thin, which may be desirable for many applications, including work function and/or voltage threshold adjustment layers. In some cases, a thickness of a vanadium layer can be greater than 2 nm, e.g., when a vanadium layer is used as a barrier layer or liner. A vanadium layer can form a continuous film—e.g., at a thickness of <5 nm, <4 nm, <3 nm, <2 nm, <1.5 nm, <1.2 nm, <1.0 nm, or <0.9 nm. A vanadium layer can be relatively smooth, with relatively low grain boundary formation. In some cases, a vanadium layer may be amorphous, with relatively low columnar crystal structures (as compared to TiN). RMS roughness of exemplary vanadium layer can be <1.0 nm, <0.7 nm, <0.5 nm, <0.4 nm, <0.35 nm, or <0.3 nm, at a thickness of less than 10 nm.

A vanadium compound (e.g., a vanadium precursor) used in processes (such as method 600) in the reactor systems in accordance with various embodiments of this disclosure, such as vanadium tetrachloride, may be relatively unstable, decomposing into, for example, vanadium trichloride and chlorine gas ($Cl_2$) a room temperature. Some processes may include heating a precursor to facilitate and/or expedite a process. Heating the vanadium compound may cause decomposition to accelerate. Vanadium trichloride is a solid at room temperature that may contaminate or clog vessels, tanks, or lines comprising vanadium tetrachloride. For example, vanadium trichloride may accumulate in a delivery vessel or bulk supply tank, or the lines therebetween or to a reaction chamber. Also, chlorine gas in a reaction chamber may cause etching of a target layer (e.g., a vanadium layer) on a substrate, which may lower cycle growth of the vanadium layer and/or cause spatial non-uniformities or lack of step coverage along the layer.

Figure 7:
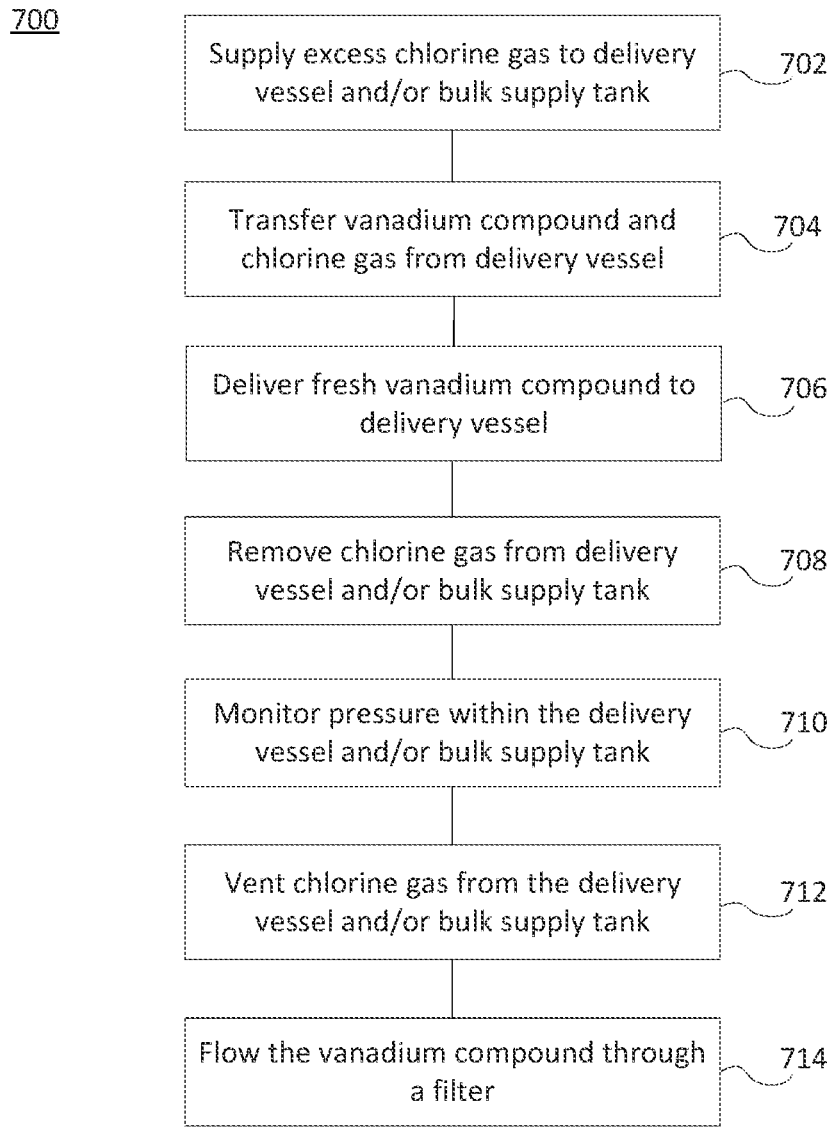
FIG. 7 illustrates a method for mitigating delivery of the decomposition products of a vanadium compound to a reaction chamber, in accordance with various embodiments of the disclosure.

Accordingly, systems and methods in accordance with various embodiments of this disclosure may comprise mitigating or preventing delivery of decomposition products of a vanadium compound to a reaction chamber (step 606). To do so, for example, the decomposition of vanadium tetrachloride may be mitigated or prevented (e.g., within the tanks, vessels, and/or lines of a chemical delivery system or reactor system). Method 700 in FIG. 7 illustrates various steps to mitigate or prevent the decomposition of a vanadium compound (e.g., vanadium tetrachloride) and/or mitigate or prevent the delivery of vanadium compound decomposition products to a reaction chamber. The steps of method 700 may be executed in any suitable order, pattern, and/or combination. Methods 600 and 700 may be performed by reactor systems and chemical delivery systems in accordance with various embodiments of this disclosure.

In various embodiments, excess chlorine gas may be supplied to a tank or vessel (e.g., delivery vessel 250 and/or bulk supply tank 220) (step 702) comprising the vanadium compound. For example, delivery vessel 250 may comprise vanadium tetrachloride, and chlorine gas may be supplied from gas source 205 to delivery vessel 250. As a similar example, bulk supply tank 220 may comprise vanadium tetrachloride, and chlorine gas may be supplied from gas source 207 to bulk supply tank 220. Because chlorine gas is a decomposition product of vanadium chloride, under Le Chatelier's principal, adding chlorine gas in an environment in which vanadium tetrachloride may decompose may slow or prevent such decomposition. In other words, adding a product (chlorine gas) of a reaction (the decomposition of vanadium tetrachloride into chlorine gas and vanadium trichloride), pushes equilibrium of the reaction toward the reactant side (vanadium tetrachloride) of the chemical reaction, thus mitigating or preventing the production of further products (chlorine gas and vanadium trichloride) (i.e., mitigating or preventing the decomposition of vanadium tetrachloride).

The chlorine gas may be supplied to a delivery vessel or bulk supply tank from a gas source. For example, chlorine gas may be supplied to delivery vessel 250 from gas source 205, and/or chlorine gas may be supplied to bulk supply tank 220 from gas source 207. In various embodiments, the chlorine gas supplied to tanks or vessels in a chemical delivery system may be supplied by a common gas source.

In various embodiments, implementing a similar principle, a carrier gas flown through the delivery vessel to deliver the vanadium compound to a reaction chamber may comprise chlorine gas. The presence of chlorine gas in the carrier gas may, similar to that discussed above, push the decomposition reaction of the vanadium compound toward the reactant side of the chemical equation (e.g., vanadium tetrachloride, preventing or mitigating decomposition thereof). While the presence of chlorine gas in a carrier gas may cause etching in the reaction chamber and/or on the substrate, by regulating the amount of chlorine gas in the carrier gas (which, again, would mitigate decomposition of the vanadium compound, which may otherwise form an unpredictable amount of chlorine gas), the amount of etching may be more predictable, and therefore, the process conditions and cycles may be configured to compensate for such etching. An unpredictable amount of chlorine gas from the decomposition of the vanadium compound may cause compensating for any resulting etching difficult because of the unknown amount of chlorine gas and the unknown etching resulting therefrom.

In various embodiments, the contents of a delivery vessel may be removed and replaced by fresh precursor, reactor, or other compound. For example, periodically, immediately before a processing cycle begins, and/or at any other suitable time, fresh vanadium compound may be supplied to a delivery vessel to be sent to a reaction chamber. To do so, the vanadium compound, and any decomposition products (e.g., chlorine gas and/or vanadium trichloride) from vanadium compound decomposition, in the delivery vessel (e.g., delivery vessel 250) may be transferred from the delivery vessel (step 704). The vanadium compound and decomposition products removed from the delivery vessel may be transferred to a disposal tank (e.g., disposal tank 262) for disposal. The contents of a disposal tank may be transferred or pumped out for final disposal, for example, by a pump 214 (e.g., of a vent system 210). In response, fresh vanadium compound (that has not been decomposed, and/or has undergone little decomposition) may be supplied to the delivery vessel (step 706) from another tank or vessel (e.g., from bulk supply tank 220). In various embodiments, in response to the delivery vessel receiving fresh vanadium compound, the vanadium compound may be transferred from the delivery vessel to a reaction chamber (e.g., step 604) for application to a substrate (e.g., step 608). The delivery vessel may receive fresh vanadium compound (after the old vanadium compound and decomposition products are removed therefrom) periodically, after the passing of a predetermined duration, before every processing cycle in the reaction chamber, and/or at any other suitable time.

Similarly, in various embodiments, vanadium compound and decomposition products thereof may be removed from a bulk supply tank and disposed in a disposal tank (e.g., using chemical delivery system 200B in which bulk supply tank 220 is coupled to disposal tank 262). In response, fresh vanadium compound may be disposed in the bulk supply tank.

Figure 5:
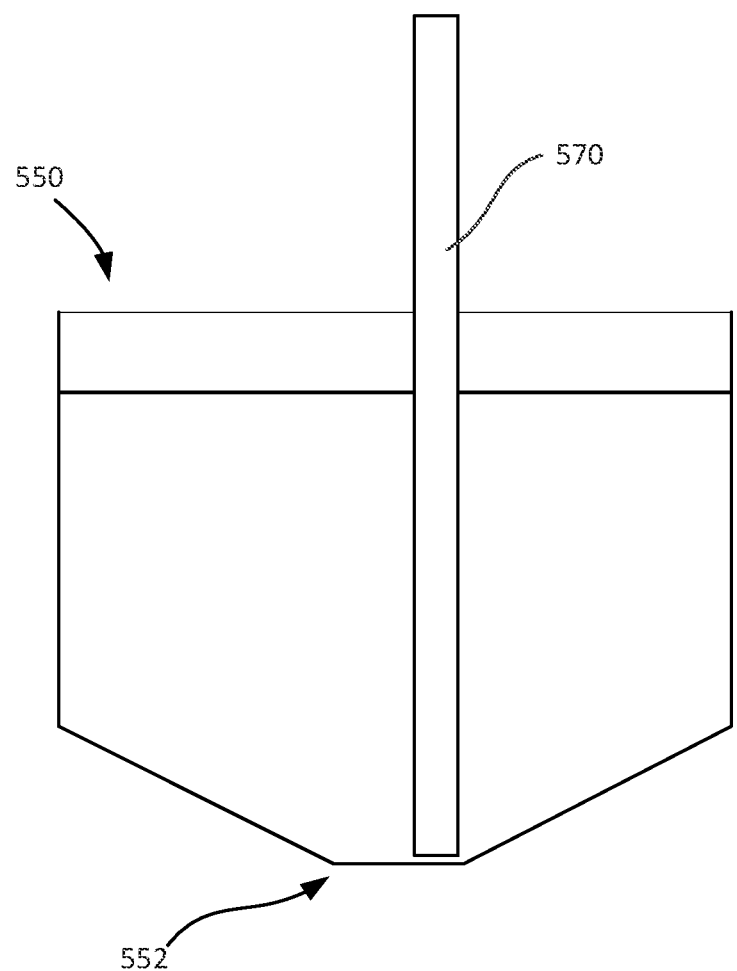
FIG. 5 illustrates a vessel suitable for use in a chemical delivery system, in accordance with various embodiments of the disclosure.

In order to make sure the old vanadium compound and its decomposition products may be thoroughly removed from a tank or vessel, the tank or vessel may comprise a recessed area at the bottom where the end of a dip tube may be disposed. For example, as depicted in FIG. 5, vessel 550 (which may be an example of a delivery vessel and/or bulk supply tank) may comprise a recessed bottom portion 552. A dip tube 570 may be disposed in vessel 550, through which compounds in vessel 550 may be removed (e.g., to be replaced by fresh compounds). An end of dip tube 570, through which compounds may be sucked from vessel 550, may be disposed in recessed bottom portion 552 of vessel 550. Such an orientation of a dip tube within a recessed bottom portion of a vessel may facilitate greater removal (i.e., most or all) of the old compound in the vessel to be replaced by fresh compound (e.g., vanadium compound).

In various embodiments, the chlorine gas accumulating in a tank or vessel from decomposition of a vanadium compound may be removed (step 708). For example, the chlorine gas accumulating in delivery vessel 250 from the decomposition of vanadium tetrachloride may be pumped out via a pump 214. As another example, the chlorine gas accumulating in bulk supply tank 220 from the decomposition of vanadium tetrachloride may be pumped out via a pump 214. The chlorine gas removed from a delivery vessel and a bulk supply tank may be removed via the same or different pumps. Additionally, chlorine gas that has been solubilized in the vanadium tetrachloride (or in a composition comprising vanadium tetrachloride) in a tank or vessel may also be removed by pumping on and/or applying vacuum pressure within the tank or vessel. Removal of the chlorine gas from a delivery vessel, for example, may mitigate the chance that chlorine gas will be transferred to a reaction chamber (e.g., during transferring a vanadium compound to the reaction chamber). In various embodiments, in response to the chlorine gas being removed from a delivery vessel, vanadium tetrachloride may be transferred from the delivery vessel to a reaction chamber (e.g., step 604) for application to a substrate (e.g., step 608).

In various embodiments, as discussed herein, a tank or vessel in a chemical delivery system may be coupled to a pressure monitor (e.g., pressure monitor 295). The pressure monitor may measure and/or monitor the pressure within the respective tank or vessel (e.g., within bulk supply tank 220 and/or delivery vessel 250) (step 710). In response to the pressure therein reaching a certain level (e.g., reaching or exceeding a threshold pressure level), the chemical delivery system and/or a component therein may act to alleviate such pressure. For example, in response a pressure monitor detecting that the pressure level in a respective tank or vessel has reached or exceeds a threshold pressure level, an alarm or other notification may be transmitted for action to be taken, or the excess chlorine gas causing the pressure may be pumped or vented out of such a vessel (step 712). In various embodiments, the pumping or venting of the chlorine gas make occur for a predetermined amount of time, until the respective pressure monitor determines that the pressure within the respective tank or vessel is at or below a certain pressure level, or according to any other suitable procedure or parameters.

In various embodiments, alternatively or additionally to a delivery vessel or bulk supply tank having a pressure monitor coupled thereto, the delivery vessel or bulk supply tank may comprise a bleed valve. The bleed valve may be configured to remain at least partially closed (e.g., closed under spring tension). In response to the pressure within the respective vessel or tank reaching a certain level, the bleed valve may open to vent the chlorine gas out of the vessel or tank (step 712) to alleviate the pressure. That is, the tension holding the bleed valve in the at least partially closed position may be overcome at a certain pressure level within the vessel or tank, such that the bleed valve opens (further) to vent the chlorine gas causing the pressure level. In various embodiments, a bleed valve may be electronically controlled (e.g., by controller 230), and may be opened (further) to vent gas out of the respective vessel or tank periodically, at certain time intervals, for certain durations, in response to a measured pressure reaching or exceeding a certain level, and/or according to any other suitable procedure or parameters.

In various embodiments, fluids (e.g., gases) vented from a vessel or tank in a chemical delivery system may pass through a scrubber (e.g., scrubber(s) 212). A scrubber may remove any unwanted (e.g., toxic) particulates, compounds, chemicals, or the like.

In various embodiments, the vanadium compound transferred from a delivery vessel (e.g., delivery vessel 250) to a reaction chamber (e.g., reaction chamber 150) may pass through a filter (e.g., filter 110). Such a filter may be configured to remove any unwanted materials or compounds from the vanadium compound and carrier fluid mixture. For example, the filter may remove particulates, chlorine gas (e.g., which may be from vanadium compound decomposition), or other contaminants that may have undesirable effects during substrate processing. In various embodiments, the filter may be configured to remove chlorine gas without removing vanadium halide compounds such as vanadium tetrachloride.

As discussed, any combination of the steps of method 700, in any order, may be implemented to mitigate or prevent decomposition of a vanadium compound (e.g., vanadium tetrachloride) and/or to mitigate or prevent delivery of vanadium compound decomposition products (e.g., chlorine gas) to a reaction chamber. For example, fresh vanadium compound may be transferred to the delivery vessel (step 706), for example, after removal of old vanadium compound and decomposition products thereof from the delivery vessel (step 704). Then, excess chlorine gas may be delivered to the delivery vessel (step 702) to mitigate the decomposition of the fresh vanadium compound (by Le Chatelier's principle, discussed herein). Then, the chlorine gas in the delivery vessel may be removed therefrom (step 708). Finally, the vanadium compound may be delivered from the delivery chamber to a reaction chamber (step 604) for application to a substrate (step 608).

After the vanadium compound is applied to the substrate, and/or any other applications are completed, the fluids remaining in the reaction chamber (e.g., unreacted vanadium compound or vanadium precursor, excess reactant, byproducts, inert gas, carrier gas, and/or the like) may be purged from the reaction chamber. For example, a purge gas may be applied to reaction chamber 150 to remove such materials and compounds, which may be pumped out by pump 114 (e.g., an example of vacuum pump 28 in FIG. 1), and/or scrubbed by scrubber 112.

The methods and systems configured to mitigate the decomposition of vanadium compounds and/or the delivery of vanadium compound decomposition products to a reaction chamber may facilitate more desirable processing conditions for substrate processing. Therefore, substrates may be processed yielding more predictable and desired results (e.g., uniform layer deposition, certain amounts of etch, etc.).

The various embodiments described above do not limit the scope of the disclosure, since these embodiments are merely examples. Any equivalent embodiments are intended to be within the scope of this disclosure. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method, comprising:
delivering vanadium tetrachloride from a bulk supply tank to a delivery vessel as a gas;
after delivering vanadium tetrachloride to the delivery vessel, adding excess chlorine gas to the delivery vessel, thereby mitigating the decomposition of vanadium tetrachloride into decomposition products of the vanadium tetrachloride;
periodically delivering the vanadium tetrachloride from the delivery vessel to a reaction chamber configured for depositing a material and in fluid communication with the delivery vessel; and
sequentially applying the vanadium tetrachloride and a reactant to a substrate disposed in the reaction chamber to form a layer comprising vanadium on the substrate by a cyclical deposition process.

2. The method of claim 1, further comprising opening a bleed valve connected to the delivery vessel when a pressure in the delivery vessel reaches a certain pressure level, wherein the bleed valve is closed when a pressure in the delivery vessel is below the certain pressure level.

3. The method of claim 1, further comprising periodically transferring the vanadium tetrachloride and the chlorine gas from within the delivery vessel to a disposal tank; and, after transferring the vanadium tetrachloride and the chlorine gas to the disposal tank, delivering fresh vanadium tetrachloride into the delivery vessel,
wherein periodically delivering the vanadium tetrachloride to the reaction chamber occurs after delivering the fresh vanadium tetrachloride to the delivery vessel.

4. The method of claim 3, wherein the delivery vessel comprises a bottom recessed area, wherein a tip of a dip tube is disposed within the bottom recessed area, and wherein the vanadium tetrachloride and the chlorine gas are transferred to the disposal tank through the dip tube.

5. The method of claim 3, wherein the fresh vanadium tetrachloride is disposed into the delivery vessel from the bulk supply tank in fluid communication with the delivery vessel.

6. The method of claim 5, further comprising mitigating decomposition of the fresh vanadium tetrachloride within the bulk supply tank.

7. The method of claim 6, wherein the mitigating decomposition of the fresh vanadium tetrachloride within the bulk supply tank comprises supplying excess chlorine gas to the bulk supply tank.

8. The method of claim 6, wherein the mitigating decomposition of the fresh vanadium tetrachloride within the bulk supply tank comprises removing the chlorine gas from the bulk supply tank.

9. The method of claim 8, wherein the removing the chlorine gas from the bulk supply tank further comprises removing solubilized chlorine gas comprised in a composition comprising the fresh vanadium tetrachloride from the bulk supply tank.

10. The method of claim 1, further comprising removing the chlorine gas from the delivery vessel.

11. The method of claim 10, wherein the removing the chlorine gas from the delivery vessel further comprises removing solubilized chlorine gas comprised in a composition comprising the vanadium tetrachloride from the delivery vessel.

12. The method of claim 1, further comprising:
monitoring a pressure within the delivery vessel; and
venting, through a vent valve of the delivery vessel, one or more of the decomposition products out of the delivery vessel in response to the pressure exceeding a pressure threshold level.

13. The method of claim 1, further comprising periodically venting, through a vent valve of the delivery vessel, one or more of the decomposition products out of the delivery vessel based on a timed venting schedule.

14. The method of claim 1, wherein the delivering the vanadium tetrachloride to the reaction chamber comprises flowing a composition comprising the vanadium tetrachloride through a filter that removes chlorine gas comprised in the composition.

15. The method of claim 6, further comprising:
monitoring a pressure within the bulk supply tank, wherein the mitigating decomposition of the fresh vanadium tetrachloride within the bulk supply tank comprises venting, through a vent valve of the bulk supply tank, one or more of the decomposition products out of the bulk supply tank in response to the pressure reaching or exceeding a pressure threshold level.

16. The method of claim 6, wherein the mitigating decomposition of the fresh vanadium tetrachloride within the bulk supply tank comprises periodically venting, through a vent valve of the bulk supply tank, one or more of the decomposition products out of the bulk supply tank based on a timed venting schedule.

\* \* \* \* \*